United States Patent
Roca I Cabarrocas et al.

(10) Patent No.: US 8,349,412 B2
(45) Date of Patent: Jan. 8, 2013

(54) DEPOSITION OF AMORPHOUS SILICON FILMS BY ELECTRON CYCLOTRON RESONANCE

(75) Inventors: Pere Roca I Cabarrocas, Villebon sur Yvette (FR); Pavel Bulkin, Villebon sur Yvette (FR); Dmitri Daineka, Palaiseau (FR); Thien Hai Dao, Palaiseau (FR); Patrick Leempoel, Brussels (BE); Pierre Descamps, Rixensart (BE); Thibault Kervyn De Meerendre, Brussels (BE)

(73) Assignees: Ecole Polytechnique, Palaiseau (FR); Dow Corning Corporation, Midland, MI (US)

( * ) Notice: Subject to any disclaimer, the term of this patent is extended or adjusted under 35 U.S.C. 154(b) by 851 days.

(21) Appl. No.: 12/447,630

(22) PCT Filed: Nov. 14, 2006

(86) PCT No.: PCT/IB2006/003960
§ 371 (c)(1),
(2), (4) Date: Jul. 10, 2009

(87) PCT Pub. No.: WO2008/053271
PCT Pub. Date: May 8, 2008

(65) Prior Publication Data
US 2010/0068415 A1 Mar. 18, 2010

(30) Foreign Application Priority Data
Nov. 2, 2006 (EP) .................... 06301114

(51) Int. Cl.
*H05H 1/46* (2006.01)
(52) U.S. Cl. ...................................... 427/578
(58) Field of Classification Search .................. 427/575, 427/578
See application file for complete search history.

(56) References Cited

U.S. PATENT DOCUMENTS
5,130,170 A * 7/1992 Kanai et al. .................. 427/575
(Continued)

FOREIGN PATENT DOCUMENTS
EP        0233613        8/1987
(Continued)

OTHER PUBLICATIONS
Daineka, D., et al., "Control and Monitoring of Optical Thin Films Deposition in a Matrix Distributed Electron Cyclotron Resonance Reactor," European Physical Journal, Applied Physics EDP Sciences France, vol. 28, No. 3, Dec. 2004, pp. 343-346.
(Continued)

*Primary Examiner* — Leo B Tentoni
(74) *Attorney, Agent, or Firm* — Leason Ellis LLP

(57) ABSTRACT

A method is described for forming a film of amorphous silicon (a-Si:H) on a substrate by deposition from a plasma. The substrate is placed in an enclosure, a film precursor gas is introduced into the enclosure, and unreacted and dissociated gas is extracted from the enclosure so as to provide a low pressure in the enclosure. Microwave energy is introduced into the gas within the enclosure to produce a plasma therein by distributed electron cyclotron resonance (DECR) and cause material to be deposited from the plasma on the substrate. The substrate is held during deposition at a temperature in the range 200-600° C., preferably 225-350° C. and a bias voltage is applied to the substrate at a level to give rise to a sheath potential in the range −30 to −105V, preferably using a source of RF power in the range of 50-250 mW/cm2 of the area of the substrate holder.

8 Claims, 12 Drawing Sheets

U.S. PATENT DOCUMENTS

| | | | |
|---|---|---|---|
| 5,429,685 | A | 7/1995 | Saito et al. |
| 5,536,914 | A | 7/1996 | Pelletier et al. |
| 5,658,440 | A * | 8/1997 | Templeton et al. ...... 204/192.37 |
| 5,666,023 | A | 9/1997 | Pelletier et al. |
| 6,407,359 | B1 | 6/2002 | Lagarde et al. |
| 2002/0022349 | A1 | 2/2002 | Sugiyama et al. |
| 2003/0194508 | A1 | 10/2003 | Carpenter et al. |
| 2004/0247948 | A1 | 12/2004 | Behle et al. |
| 2005/0062387 | A1* | 3/2005 | Lacoste et al. ........... 313/231.31 |
| 2007/0117351 | A1* | 5/2007 | Bradl et al. .................... 438/460 |

FOREIGN PATENT DOCUMENTS

| | | |
|---|---|---|
| EP | 0487114 | 5/1992 |
| EP | 1075168 | 2/2001 |
| GB | 2083701 | 3/1982 |
| JP | 05314918 | 11/1993 |
| JP | 10-081968 | 3/1998 |
| WO | WO-2008/052703 | 5/2008 |
| WO | WO-2008/052704 | 5/2008 |
| WO | WO-2008/052705 | 5/2008 |
| WO | WO-2008/052706 | 5/2008 |
| WO | WO-2008/052707 | 5/2008 |
| WO | WO-2008/052708 | 5/2008 |

OTHER PUBLICATIONS

Shing, Y.H., et al., "Electron Cyclotron Resonance Microwave Plasma Deposition of A-SI: H and A-Sic:H Films," Solar Cells, Elsevier Sequoia S.A., vol. 30, No. 1/4, May 1, 1991, pp. 391-401.

Plais, F., et al., "Low Temperature Deposition of SI02 by Distributed Electron Cyclotron Resonance Plasma-Enhanced Chemical Vapor Deposition," Journal of the Electrochemical Society, Electrochemical Society, Manchester, New Hampshire, vol. 139, No. 5, May 1, 1992, pp. 1489-1495.

Daineka, D., et al., "High density plasma enhanced chemical vapour deposition of thin films" European Physical Journal—Applied Physics, vol. 26, No. 1, Apr. 2004, pp. 3-9, XP002462386.

"Compact Microwave Plasma Source" IBM Technical Disclosure Bulletin, IBM Corp. New York, US, vol. 35, No. 5, Oct. 1, 1992, pp. 307-308, XP000312985 ISSN; 0018-8689.

Bulkin, P., et al., "Plasma enhanced chemical vapour deposition of silica thin films in an integrated distributed electron cyclotron resonance reactor" Preparation and Characterization, Elsevier Sequoia, NL, vol. 308-309, Oct. 31, 1997, pp. 63-67, XP004524338 ISSN: 0040-6090.

Jes Asmussenjr et al: "The Design and Application of Electron Cyclotron Resonance Discharges" IEEE Transactions on Plasma Science, IEEE Service Centre, Piscataway, JN, US, vol. 25, No. 6, Dec. 1997, XP011044935 ISSN: 0093-3813.

Bechu S et al: "Multi-dipolar plasmas for plasma-based ion implantation and deposition" Surface & Coatings Technology Elsevier Switzerland, vol. 186, No. 1-2, Aug. 2, 2004, pp. 170-176, XP0024261912 ISSN: 0257-8972.

Bardos L et al: "Microwave Surfatron Systems for Plasma Processing" Journal of Vacuum Science and Technology: Part A, AVS/AIP, Melville, NY, US, vol. 14, No. 2, Mar. 1, 1996, pp. 474-477, X000620528 ISSN: 0734-2101.

Sakudo N et al: "Development of hybrid pulse plasma coating system" Surface and Coatings Technology Elsevier Switzerland, vol. 136, No. 1-3, Feb. 2, 2001, pp. 23-27, XP002427492 ISSN: 02578972.

Awazu K et al: "Films formed by hybrid pulse plasma coating (HPPC) system" AIP Conference Proceedings AIP USA, No. 576, 2001, pp. 955-598, XP002427493 ISSN: 094-243X.

Bulkin P et al: "Deposition of silicon alloys in an integrated distributed electron cyclotron resonance reactor: Oxide, nitride, oxinitrides, and multilayer structures" Journal of Vacuum Science and Technology A.Vacuum, Surfaces and Films, American Institute of Physics, New York, NY, US, vol. 20, No. 2, Mar. 2002, pp. 338-343, PX012005960 ISSN: 0734-2101.

Girard G et al, "Matrix-distributed ECR-PECVD for high-rate deposition of silica for applications in integrated optics" Proceedings of the SPIE—The International Society for Optical Engineering SPIE-Int. Soc. Opt. Eng USA, vol. 4944, 2003, pp. 62-71, PX002436134 ISSN: 0277-786X.

Lagarde, T, et al., "Determination of the EEDF by Langmuir Probe diagnostic in a plasma excited at ECR above a multipolar magnetic field", Plasma Sources Sci. Technol. 10, 181-190, 2001.

Moisan & Pelletier, "Microwave Excited Plasmas,"Elsevier, 1992, Appendix 9.1 pp. 269-271.

Fontcuberta, A., et al., "Structure and hydrogen content of polymorphous silicon thin films studied by spectroscopic ellipsometry and nuclear measurements" Physical Review B 69,125307/1-10, 2004.

Rafat, N. et al., "The limiting efficiency of band gap graded solar cells" Solar Energy Materials & Solar Cells, 55(1998) 341-361.

Foelsch, J., et al., Conference Record of the IEEE Photovoltaic Specialists Conference (1996) 25th 133-1136.

Dalal, V. et al., "Improvements in stability of a-silicon solar cells through the use of band gap grading" Conference Record of IEEE Photovoltaic Specialists Conference (1993), 23rd 806-20.

Suzuki et al, "Radio-frequency biased microwave plasma etching technique: A method to increase SiO2 etch rate", J Vac. Sci. Technol. B 3(4), 1025-1033, Jul./Aug. 1985.

* cited by examiner

DEPOSITION OF AMORPHOUS SILICON FILMS BY ELECTRON CYCLOTRON RESONANCE

CLAIM OF PRIORITY

This application is a U.S. national phase application under 35 U.S.C. §371 of International Patent Application No. PCT/IB2006/003960 filed Nov. 14, 2006, and claims the benefit of priority of EP Patent Application No. 06301114.2 filed Nov. 2, 2006, the disclosures of all of which are hereby incorporated by reference in their entireties. The International Application was published in English on May 8, 2008 as WO 2008/053271.

This invention relates to a method for forming a film of hydrogenated amorphous silicon (a-Si:H), hereinafter referred to simply as "amorphous silicon" by deposition from a plasma on to a work surface. Typically, hydrogenated amorphous silicon contains from 3-20% hydrogen, whose presence serves to passivate the dangling bonds which are defects. More particularly, the invention concerns the use of microwave energy to produce the plasma using electron cyclotron resonance to dissociate a silane, for example $SiH_4$, $Si_2H_6$ or a higher order of oligomer, in a process known as plasma-enhanced CVD (chemical vapor deposition). Other precursor gases which can be used to deposit amorphous silicon include molecules in which silicon is present in combination with one or more of carbon, oxygen, or nitrogen, optionally together with hydrogen. One area of particular interest as regards the use of amorphous silicon films is in devices for converting solar energy into electrical power. Such amorphous silicon material can also find use in electronic applications such as TFT for display.

In the technical field of exciting a plasma to electron cyclotron resonance (hereinafter abbreviated to "ECR"), resonance is obtained when the frequency of gyration of an electron in a static or quasi-static magnetic field is equal to the frequency of the applied accelerating electric field. This resonance is obtained for a magnetic field B at an excitation frequency f which is related to B by the following relationship:

$$B = 2\pi m f/e \quad (1)$$

wherein m and e are the mass and the charge of an electron.

When exciting a plasma at electron cyclotron resonance frequency, electrons revolve in phase with the electric field and continuously gain energy from the external excitation source where the ECR condition (1) is met such as to reach the threshold energy necessary for dissociating or ionizing the gas. To satisfy this condition, it is necessary firstly that the electron remains trapped in the magnetic field lines, i.e. that its radius of gyration is small enough with respect to the static magnetic field gradient for the electron to see a substantially constant magnetic field during its gyration, and secondly that the frequency of gyration remains large relative to the frequency of collision between electrons and neutral elements such as atoms and/or molecules. In other words, the best conditions for exciting a plasma to electron cyclotron resonance are expected to be obtained when simultaneously gas pressure is relatively low and the excitation frequency f is high, which also means that the magnetic field intensity B must be high.

A major difficulty with conventional divergent ECR is that it is not possible to produce a plasma whose density is substantially uniform over a large area. This means that it cannot be used, for example, to deposit a substantially uniform layer of material on a work surface of large size. To overcome this problem, a technique has been developed which is known as distributed electron cyclotron resonance (DECR), which employs an apparatus in which a plurality of plasma excitation devices is formed into a network, with the devices collectively generating a plasma whose density is substantially uniform at the work surface. The individual plasma excitation devices are each constituted by a wire applicator of microwave energy, having one end connected to a source for producing microwave energy and having an opposite end fitted with at least one magnetic dipole for creating at least one surface having a magnetic field that is constant and of an intensity corresponding to electron cyclotron resonance. The dipole is mounted at the end of the microwave applicator in such a manner as to ensure that electrons accelerated to electron cyclotron resonance oscillate between the poles so as to create a plasma diffusion zone situated on the side of the dipole that is remote from the end of the applicator. The individual excitation devices are distributed relative to one another and in proximity with the work surface so as to create together a plasma that is uniform for the work surface.

Such a DECR apparatus is described in U.S. Pat. No. 6,407,359 (corresponding to EP-1075168), and more detailed discussion of the apparatus described therein is given below, with reference to drawings. As is apparent from those drawings, excitation devices, as viewed from the substrate, take the form of a generally rectangular array, by which we include also the particular case where the rectangle is a square, and such an apparatus is therefore sometimes referred to as matrix DECR (MDECR) apparatus. It is to be understood, however, that the present invention could also be applied to a DECR apparatus where the excitation devices were arranged in a non-rectangular two-dimensional network, for example in a hexagonal network or where there are two parallel lines of devices, with the devices in one line being offset with respect to one another. An example of a hexagonal array is given in "Determination of the EEDF by Langmuir probe diagnostic in a plasma excited at ECR above a multipolar magnetic field", T. Lagarde, Y. Arna, A. Lacoste, J. Pelletier, Plasma Sources Sci. Technol. 10, 181-190, 2001. The devices could also be disposed as a circular, part-circular, or near-circular array. It should be noted that, in some work done by the present inventors, depositions have been carried out with a central plasma excitation device being surrounded by three or six devices, the surrounding devices having the polarity of their magnets being oppositely disposed to the magnet of the central device and being arranged in a triangular or hexagonal array respectively. Furthermore, the invention can be applied to a DECR apparatus which is not of an MDECR type. Thus, for example, it is applicable to a DECR reactor which, historically, preceded the MDECR type, and which has a cylindrical shape and uses long antennas and magnets that extend from to the top to the bottom of the cylinder. Such arrangement is described in "Microwave Excited Plasmas" by Michel Moisan and Jacques Pelletier, Elsevier, 1992, and would be suitable for homogeneously coating a cylindrical substrate such as a tube, or an object which is characterized by a dimension (length, radius) which is small as compared to the plasma ambipolar mean free path (See above reference, Appendix 9.1 page 269-271). This object can have a flat surface lying in the central part of the plasma and oriented perpendicular to the axis of the cylinder.

Although DECR technology offers the possibility of depositing material at a high deposition rate, it has proved difficult to effect such deposition in such a way that the material is of high quality, particularly as regards use in solar cells. We have now found that a desirable combination of certain properties can be achieved by correct control of two factors, namely the ion energy and the temperature of the substrate. The properties in relation to which these two factors have been found to be particularly significant are bandgap (a low bandgap is desirable), density (a high density is desirable), disorder parameter (a low level is desirable) and surface roughness (a low level of roughness is desirable). The first three of these properties are in turn related to hydrogen content, in that hydrogen content in a preferred range (3-20%) contributes to the achievement of desirable values for the properties. An appropriate combination of ion energy and substrate temperature has been found to permit the growing of layers which are of high optical and electrical quality, allowing their use in thin-film solar cell by optimizing the capture of the solar light and promoting adequate transport of charge.

According to the present invention there is provided a method for forming a film of amorphous silicon (a-Si:H) on a substrate by deposition from a plasma, which comprises placing the substrate in an enclosure, introducing into the enclosure a film precursor gas at a flow rate, extracting unreacted and dissociated gas from the enclosure so as to provide a low pressure in the enclosure, and introducing microwave energy into gas within the enclosure to produce a plasma therein by distributed electron cyclotron resonance (DECR) and cause material to be deposited from the plasma on the substrate, wherein the substrate is held during deposition at a temperature in the range 200-600° C., and wherein a bias voltage is applied to the substrate at a level to give rise to a sheath potential in the range −30 to −105V.

Preferably, the sheath potential is in the range −35 to −85V. Preferably the above mentioned temperature is in the range 225-350° C.

Reference is made herein to the "hot electron confinement envelope". The definition of "hot electron confinement envelope" required firstly a definition of "hot electron component zones". The hot electron confinement zones are those regions in which the hot (fast) primary electrons are trapped. These are regions in which the electrons oscillate between two adjacent magnet poles of opposite polarity, which could be two poles of a single magnet (hereinafter referred to as "intra-magnet poles") or poles of two adjacent magnets (hereinafter referred to as "inter-magnet poles"), in which the adiabatic approximation condition is met (Larmor radius is small with respect to the magnetic field gradient), and in which the electrons gain energy by crossing regions where the ECR coupling condition is met.

The magnets and the hot electron confinement zones define a hot electron confinement envelope. This is a volume which is the envelope of the array of magnets, expanded parallel to the magnetic axes of the magnets in both directions by the distance by which the inter-magnet zones (if any) extend beyond the ends of the magnets, and expanded perpendicular to the magnetic axes of the magnets in all directions by the distance by which the intra-magnet zones extend beyond the outward facing surfaces of the magnets.

The invention is further described below with reference to the accompanying drawings, in which.

Figure 1:
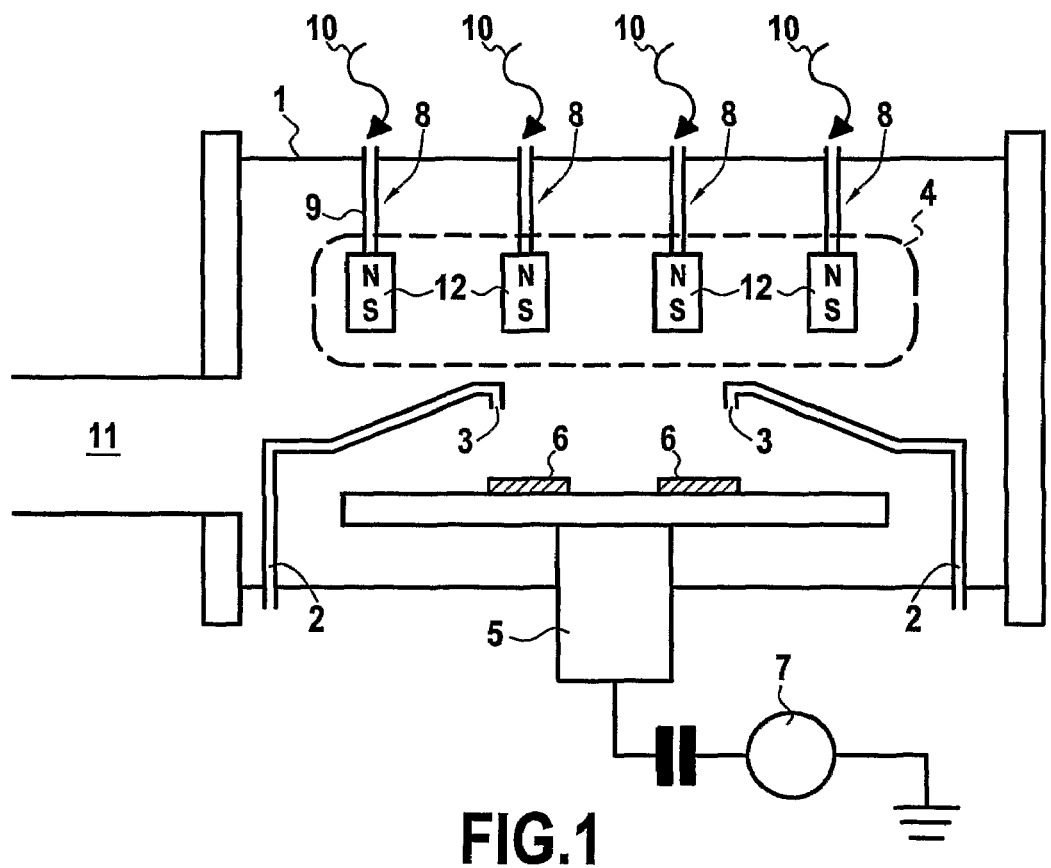
FIG. 1 is a diagrammatical elevation view showing a plasma production apparatus for use in carrying out the present invention.
Figure 2:
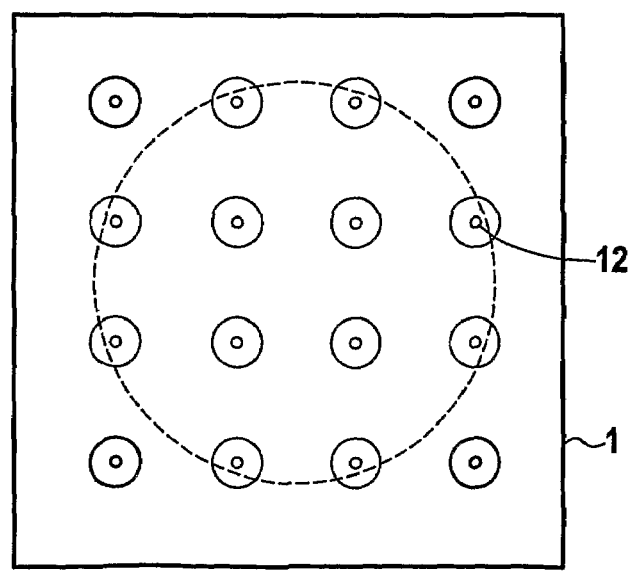
FIG. 2 is a plan view of an example of the type of apparatus of FIG. 1.

FIGS. 1 and 2 show an apparatus for producing a plasma relative to a substrate on which a film is to be deposited. The apparatus comprises a sealed enclosure 1 represented diagrammatically and fitted with devices for admitting gas (discussed further below) and for pumping out unreacted and dissociated gas (via exit 11), that enable the pressure of the gas that is to be ionized, or dissociated to be maintained at a desired value which, for example, can be about $10^{-2}$ to $2 \times 10^{-1}$ Pascals, depending on the nature of the gas and the excitation frequency. However, gas pressures less than $10^{-2}$ Pa (say down to $10^{-4}$ Pa, for example), or above $2 \times 10^{-1}$ Pa (say up to $5 \times 10^{-1}$ Pa, or even 1 Pa or more) can be used. For example, pumping can be carried out by a 1600 l/s Alcatel Turbomolecular pump, which serves to extract gas from the enclosure.

Gas is admitted to the enclosure from an appropriate gas source, e.g. a cylinder of gas under pressure, under the control of a mass flow controller (MFC). The gas may, for example, comprise $SiH_4$ as a film precursor gas, or one of the other gases mentioned above in relation to the deposition of amorphous silicon. In addition to the film precursor there may also be introduced a non-reactive diluent gas, such as He, Ne or Ar, a reactive gas, such as hydrogen, nitrogen or oxygen, or a dopant gas such as diborane, trimethyl boron or phosphine. Typically any such other gases are introduced into the enclosure through the same port or ports as the film precursor gas, as a mixture therewith, but they could be introduced separately. The gas feeding system should ensure the appropriate flow of gases, which typically ranges from 1 to 1000 sccm (standard cubic centimeter per minute), into the reactor.

The injection port for the gas generally consists of a single tube, or a plurality of tubes 2, entering the deposition chamber. The tube, or each tube, if there is more than one, can be extended by a grid to ensure more even distribution of the gas inside the deposition chamber. Injection can be carried out anywhere in the reactor but it is preferred to direct the film precursor gas towards the substrate surface. As used herein, it is to be understood that the reference to the outlet being arranged to direct gas towards the substrate surface covers not only the case where the gas is aimed directly at the substrate surface on which the film is to be deposited, but also any case where the said surface is wholly within an angle defined between a line extending from the outlet, in the direction of gas flow therefrom, and a line which is at right angles thereto and passes through the outlet. Under such circumstances the gas flow emerging from the outlet will have a vector component towards all portions of the said surface.

One way of carrying out the injection, referred as "point" injection, is shown diagrammatically in FIG. 1. In this arrangement the film precursor is introduced through a pipe, or a plurality of pipes (two are shown), each of which has its outlet 3 located between the hot electron confinement envelope 4 (shown by a broken line) and the substrate surface, and directed towards that surface.

The relative merits of these and other injection arrangements are discussed in our copending applications filed on the same date as the present application and entitled "Method and apparatus for forming a film by deposition from a plasma" and "Device for forming a film by deposition from a plasma" (our references G28331EP and G28332EP). Attention is also directed to our copending application filed on the same date as the present application and entitled "Method for forming a film of an amorphous material by deposition from a plasma" (our reference G27557EP) for a discussion of the impact of the flow rate and residence time of the film precursor gas on the properties of the films produced.

The plasma chamber is equipped with a heated substrate holder 5. At least one substrate 6, and optionally a plurality of such substrates, as shown, is mounted on the holder 5. The relationship between the substrate holder and the substrates is discussed further below.

One function of the substrate holder is to heat the substrates to the required deposition temperature. This is typically between room temperature and 600° C., and in the case of the deposition of amorphous silicon is preferably in excess of 200° C., more preferably between 225° C. and 350° C. This can be achieved by circulating a hot fluid inside the substrate holder but could also be achieved by electrically heating resistors embedded in the substrate holder. Alternatively, however, it is possible to heat the substrates directly, for example by using infrared lamps. The importance of heating to an appropriate temperature is discussed further below.

Another function of the substrate holder is to allow polarization of the substrate such as to control the energy of ions towards the substrate. Polarization can be achieved using either a source of RF voltage or using a DC voltage and requires the substrate holder to be electrically insulated from ground. Polarization is achieved by connecting the electrically insulated substrate holder to an appropriate RF or DC generator 16 with an adequate matching circuit in the case of RF polarization. When depositing on an insulating substrate, or on an insulating layer previously deposited on a substrate (which may or may not be insulating), the use of an RF generator is preferred, and this is shown in FIG. 1, where the RF generator is denoted by reference numeral 7. When depositing on a conductive substrate or on a conductive layer previously deposited on a substrate which may or may not be conductive, the bias can be applied by either an RF or DC generator with suitable electrical connection to the substrate surface. In a specific embodiment an RF-bias was applied using a 13.56 MHz Dressler generator connected to the substrate holder via an automatic tuning box. Even when using an RF generator, the resulting bias on the substrate comprises a DC bias component, as a result of conditions in the plasma. An explanation of how this occurs can be found, in the content of the description of a completely different plasma process, in Suzuki et al, "Radio-frequency biased microwave plasma etching technique: A method to increase $SiO_2$ etch rate", J. Vac. Sci. Technol. B 3(4), 1025-1033, July/August 1985. The importance of using an appropriate level of bias is discussed further below.

The plasma production apparatus has a series of individual plasma excitation devices 8 which are spaced apart from one another and operate together to create a plasma that is uniform for the substrates. Each individual plasma excitation device comprises an elongate microwave energy applicator 9. Each energy applicator 9 has one of its ends connected to a microwave energy source 10 which lies outside the enclosure 1. Alternatively, however, a single microwave energy source can feed microwaves to all the applicators, or there can be a plurality of energy sources fewer in number than the number of applicators. For example, an array of sixteen applicators can conveniently be fed by two 2.45 GHz microwave generators, each of 2 kW maximum power, and each feeding eight applicators via a power splitter and respective slug tuners. In order to ensure proper transfer of the microwave energy into the plasma, each applicator is preferably equipped with a matching device that minimizes, or at least reduces, the reflected power from the device.

Each microwave applicator has its free end connected to at least one permanent magnet 12. Each magnet (preferably) has its magnetic axis parallel to the long axis of the magnet itself. In one particular form of this arrangement all the plasma excitation devices have their magnets oriented in the same direction (a monopolar configuration). i.e. all their north poles are at the top and all their south poles are at the bottom, or vice versa. In another, some of each pole are at the top and some of each pole are at the bottom (a multipolar configuration). An example of the latter is an array, where, viewed from one end as in FIG. 2, and passing along any given row or column of devices, one successively encounters poles of alternate polarity. Yet another example is where all the magnets in a given row (or column) have the same polarity, but the columns (or rows) are of alternative polarity. However, arrangements can also be used where the magnetic axes of the magnets are not parallel to the long axes of the magnets themselves, provided there are significant regions where the lines of the magnetic field are parallel to the propagation vector of microwaves. This is necessary in order to ensure the existence of significant regions where ECR damping can occur.

A discussion will now be given as to the significance of ion energy and substrate temperature in providing the desirable properties identified above, and how ion energy and substrate temperature can be appropriately controlled.

Ion Energy

Figure 3:
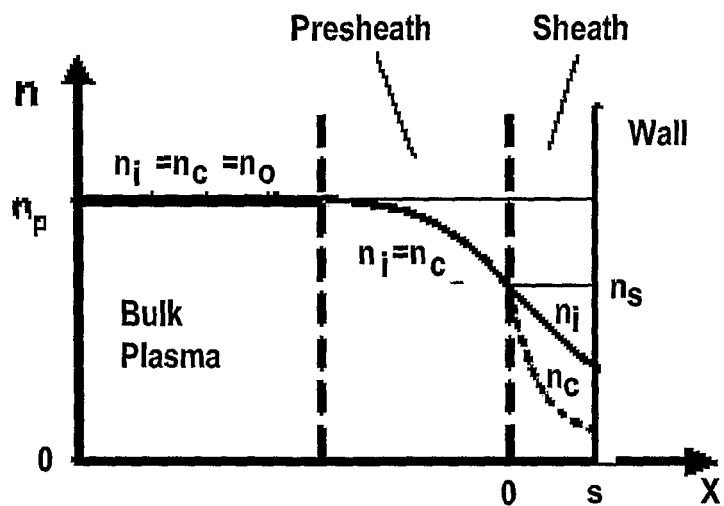
FIG. 3 is a diagram showing charge distribution and resulting voltage in a region extending from the main body of a plasma to a wall in contact with the plasma.

When a plasma is formed, it is electrically neutral in the bulk, meaning that the number of electrons equals that of the positive charges. However at its boundaries, due to the very high mobility of the electrons as compared to that of the heavy ions, electrons are collected by the walls such that the plasma electro-neutrality does not exist close to these boundaries. The region where the electro-neutrality does not exist is called the sheath. This is illustrated in FIG. 3.

The plasma is hence connected to the wall via a sheath where a voltage drop equalizes the ion and electron currents (quasi neutrality requires that the number of electrons lost equals the number of ions lost) by pulling-out positive ions and reflecting-in negative charges (electrons). To confine fast electrons, the plasma potential is positive with respect to the walls. That means that slow electrons and negative ions experience a repulsive force in the plasma by the sheath, while positives ions are extracted and accelerated by the sheath to the walls.

The energy gained by the ions, accelerated in the sheath, is a function of the potential drop between the plasma and the substrate (sheath potential) as well as the eventual energy gained or lost in collisions undergone in the sheath.

Except for RF plasmas the sheath thickness is of the order of a few Debye lengths. The latter is the characteristic length scale of a plasma associated with the electron motion. It can be calculated from the electron temperature and the plasma density and is equal to:

$$\lambda_D = \sqrt{\frac{\varepsilon_o k T_e}{n e^2}} = 743 \sqrt{\frac{T_e}{n_e}} \text{ (cm)}$$

and hence the sheath thickness is given by:

$$x_s = a\lambda_D = a \sqrt{\frac{\varepsilon_o k T_e}{n e^2}} \text{ (cm)}$$

where a is in the range 2 to 5.

Considering the characteristics of a DECR plasma used for deposition of amorphous silicon, the electron temperature and charge density at the location of the substrate holder have been measured to be equal to $kT_e = 1.5$ eV and $n_e = 10^{16}$ m$^{-3}$ or $10^{10}$ cm$^{-3}$. Thus, $\lambda_D$ is of order 90 μm and hence the sheath thickness is in the 180-450 μm range, which is very small.

The DECR plasma is also operating at a very low pressure; typically in the 1-10 mTorr (about 0.133 to 1.33 Pa) range. In such conditions the mean free path of the species (i.e. the average distance a particle can travel before colliding with another particle) is of the order of 50,000-5,000 μm, which is much larger than the sheath thickness. This indicates that ions entering the sheath will be guided normal to the surface by the electric field and will almost always reach the surface without colliding with other ions.

The combination of a high density plasma and a low operating pressure is such that the sheath is effectively collisionless. Hence, besides having an initial energy (likely to be low due to the typical distance between the plasma source and the substrate [~10 cm]), the ions are accelerated by the electric field in the sheath and reach the surface with an energy directly proportional to sheath potential.

If any polarization is applied to the substrate (which is a "wall" in the context of the above discussion) it will add to the plasma potential such that the ion energy will be modulated by such bias potential.

$$E_{ion} = e(V_p - V_{dc}) = eV_{sheath}$$

where:
  Vp: potential difference between the plasma and the ground taken as reference,
  Vdc: DC bias resulting from the RF polarization.

Figure 4:
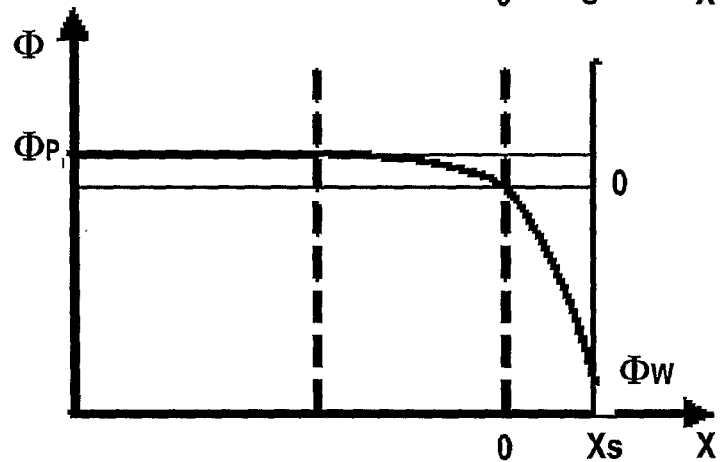
FIG. 4 shows diagrammatically how the ion energy $E_{ion}$ is made up.
Figure 4:
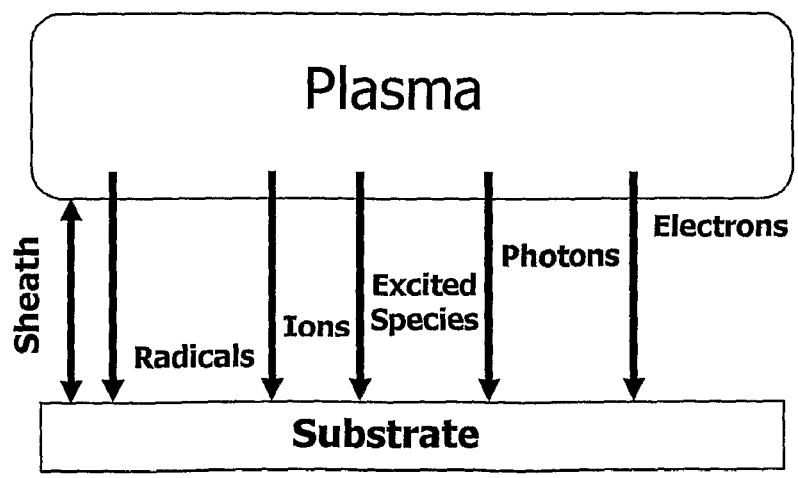

The situation is summarised diagrammatically in FIG. 4.

Sheath Potential

As indicated above, the sheath potential, which determines the acceleration of the ions prior to hitting the substrate, is an important value to determine.

In the absence of any external polarization, the substrate auto-polarizes due to the asymmetric collection of charges. This defines what can be referred to as the unbiased sheath potential, Vus, i.e. the potential difference between the plasma bulk and the plasma boundary (at the substrate holder).

$$Vus = Vp - Vf$$

where:
  Vf: potential difference between the "floating" substrate (i.e. not grounded) and the ground taken as reference. A floating potential is defined as the bias voltage where the probe (substrate) draws no net current and it is determined by the balance of electron and ion currents to the probe.

This excess of charges will need to be taken into account when externally biasing the substrate as the power required to bias the substrate is likely to be higher than expected due to the initial presence of this excess of charges.

As mentioned above, biasing is typically realized by imposing an 13.56 MHz RF voltage on the substrate, which allows the polarization of both conductive and materials. Due to the diode-type I-V response of the substrate in the plasma, a DC voltage builds-up at the surface, as explained in the Suzuki et al reference mentioned above. This voltage adds to the plasma potential to give the total potential difference across the sheath and which will accelerate the ions.

To determine the floating potential, experiments have been conducted by applying a variable RF bias to the substrate holder and measuring both the resulting DC polarization (Vdc) and the RF power required to reach equilibrium. This also makes it possible to determine the ion current at the substrate holder.

Different experiments have been conducted in similar conditions and are described in the table below. In all cases, each antenna was fed with the same MW power but either 4 or 16 antennas were used, which had little effect on the ion current (see below).

TABLE 1

| Sample | Temp °C. | Carrier plate | Ag glue | Antenna | Distance cm | Injection | SiH4 sccm | PMW kW |
|---|---|---|---|---|---|---|---|---|
| d170405 | 275 | Yes | No | 16 | 10 | Point | 100 | 2 |
| d070705 | 275 | Yes | No | 16 | 10 | Point | 100 | 2 |
| d120705 | 275 | Yes | No | 16 | 10 | Point | 100 | 2 |
| d020905 | 285 | Yes | No | 16 | 10 | Point | 100 | 2 |
| d201005 | 275 | Yes | No | 16 | 10 | Point | 100 | 2 |
| d180206 | 310 | Yes | No | 16 | 10 | Point | 100 | 2 |
| d040206 | 250 | No | Yes | 16 | 11 | Tube | 105 | 2 |
| d210605 | 275 | Yes | No | 4 center | 10 | Point | 100 | 0.5 |
| d240605 | 275 | Yes | No | 4 center | 5 | Point | 100 | 0.5 |
| d240605a | 275 | Yes | No | 4 center | 5 | Point | 100 | 0.5 |

Figure 5:
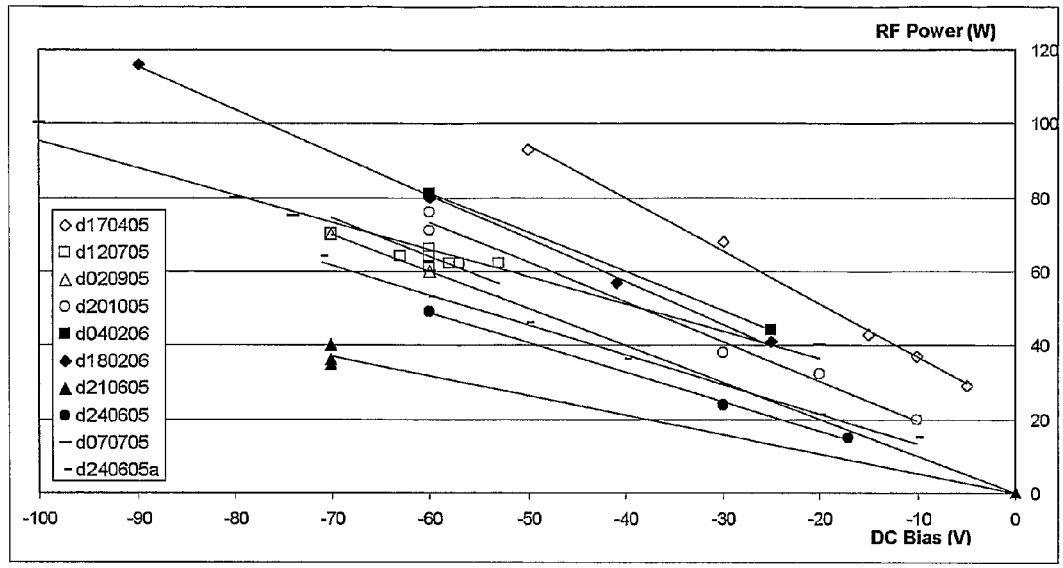
FIG. 5 is a graph showing the linear relationship between the induced DC bias component of the substrate voltage and RF power applied to the substrate.

The results are shown in FIG. 5, where it will be seen that there is a linear relationship between the induced DC bias voltage and the injected RF power. For completeness, the Table 1 gives a substantial amount of information about the conditions under which deposition was carried out, and the meaning of the various columns in Table 1 is briefly summarised below. However, in the context of this part of the discussion what matters is that the linear relationship just referred to exists even under a variety of conditions.

In Table 1:

"Temp" represents the nominal temperature of the substrate. For reasons explained below, this was not the actual temperature except in the case of sample d040206.

Carrier plate indicates whether the substrate was placed on a carrier plate, which was itself placed on a heated substrate holder, or directly on the substrate holder.

The "Yes" under "Ag" glue denotes that the sample concerned was glued to the substrate holder, something which is discussed further below in relation to the control of temperature.

The column headed "Antenna" states the number of antennas present, and, in the case of the 4-antenna arrangement, that the antennas were located, as seen in plan, in the central region of the reactor.

"Distance" denotes the vertical distance between the substrate and the bottom of the magnets of the antennas.

"Injection" denotes the type of injection. The term "point injection" is explained above. In "tube" injection the precursor gas is injected in a direction toward the substrate from a location immediately above, or in, the hot electron confinement envelope.

The penultimate column of Table 1 gives the rate, in standard cubic cm per minute, at which the precursor gas is introduced.

The final column of Table 1 gives the power of the pulsed microwave source in kW.

The linear relationship mentioned above indicates that the ion current does not change significantly as the negative RF bias is increased and that the DC bias is directly proportional to the applied RF-power. This current is due to the charge collection on the entire substrate holder and not only on the substrate. As was already known, the ion current very quickly reaches a constant value as the bias gets more negative for flat substrates. The charge collection is constant and the modification of the sheath thickness, which is known to vary as the square root of the applied voltage, does not affect charge collection for a flat substrate (not the case of a substrate for which the edge effects are important, i.e. small surface area).

Floating Potential

Some RF power is required to maintain the substrate at 0V versus ground. This is due to the fact that the floating potential is apparently positive versus ground and charge compensation is required as soon as the bias potential is more negative than the floating potential.

It has been found that the power delivered by the RF generator, as soon as it is connected to the substrate holder, can be approximated by the following expression:

$$P_{RF} = I * V_{sheath} = I * (V_{dc} - V_f)$$

with:
$P_{RF}$=applied RF power
I=ion current (when $V_{dc}$ is more negative than $V_{us}$)
$V_{dc}$=induced DC bias voltage versus ground
$V_f$=floating potential versus ground This is somewhat an oversimplification as it does not take into account the power lost at the decoupling capacitor, such that the real RF-power applied to the substrate holder is not known with precision. Furthermore, the RF-current may not always be directly proportional to the DC-bias, despite the linear relationship, particularly close to the floating potential.

The floating potential is hence calculated from the slope and the intercept of the $P_{RF}/V_{dc}$ line while the ion current is determined by the slope of this line. The results are presented in the table below.

TABLE 2

| Sample | Temp °C. | Carrier plate | Ag glue | Antenna | Distance cm | Injection | SiH4 sccm | PMW kW | Vf V | Jc mA/cm2 |
|---|---|---|---|---|---|---|---|---|---|---|
| d170405 | 275 | Yes | No | 16 | 10 | Point | 100 | 2 | 16 | 3.0 |
| d070705 | 275 | Yes | No | 16 | 10 | Point | 100 | 2 | 29 | 2.2 |
| d120705 | 275 | Yes | No | 16 | 10 | Point | 100 | 2 | 12 | 1.1 |
| d020905 | 285 | Yes | No | 16 | 10 | Point | 100 | 2 | 0 | 1.7 |
| d201005 | 275 | Yes | No | 16 | 10 | Point | 100 | 2 | 8 | 1.7 |
| d180206 | 310 | Yes | No | 16 | 10 | Point | 100 | 2 | 9 | 1.8 |
| d040206 | 250 | No | Yes | 16 | 11 | Tube | 105 | 2 | 17 | 1.5 |
| d210605 | 275 | Yes | No | 4 center | 10 | Point | 100 | 0.5 | 0 | 2.1 |
| d240605 | 275 | Yes | No | 4 center | 5 | Point | 100 | 0.5 | 1 | 2.2 |
| d240605a | 275 | Yes | No | 4 center | 5 | Point | 100 | 0.5 | 7 | 2.4 |

This floating potential appears quite variable even for similar deposition conditions. Looking at the available data, $V_f$ is in the +8V to +29V range for the depositions carried out with 16 antennas while it is in the 0V to +6V range for those made with 4 antennas. In both cases the variation is quite large and even two measurements done the same day (d240605 and d240605a) give values differing by 6V.

Attempt was made to find correlations with the process parameters but no trend could be extracted from these data except that $V_f$ appears larger with 16 antennas.

The value of the plasma potential was determined with respect to the floating potential in a hydrogen plasma using a device similar to a Langmuir probe. Carrying out such measurement in a silane plasma is difficult because of the deposition of the silicon film on the probe. It is seen from the table below that the plasma potential is about 5V above the floating potential and this value allows recalculation of the sheath potential under biased conditions and silane deposition.

TABLE 3

| Gas | Flow Rate sccm | Pg mTorr | Ant | MW power per antenna (W) | Plasma potential Pp (V) | Floating potential Vf (V) | Sheath potential Vus (V) |
|---|---|---|---|---|---|---|---|
| H2 | 100 | 2.66 | 16 | 125 | 25.3 | 20 | 5.3 |
| H2 | 140 | 4.23 | 16 | 125 | 24.9 | 21.1 | 3.8 |

TABLE 3-continued

| Gas | Flow Rate sccm | Pg mTorr | Ant | MW power per antenna (W) | Plasma potential Pp (V) | Floating potential Vf (V) | Sheath potential Vus (V) |
|---|---|---|---|---|---|---|---|
| H2 | 50 | 1.22 | 16 | 125 | 29.1 | 23.9 | 5.2 |
| H2 | 50 | 4.24 | 16 | 125 | 26.9 | 23.1 | 3.8 |
| H2 | 50 | 2.65 | 16 | 125 | 28.2 | 23.4 | 4.8 |
| H2 | 100 | 2.6 | 16 | 125 | 27.2 | 23 | 4.2 |
| H2 | 100 | 2.6 | 16 | 125 | 26.5 | 22.1 | 4.4 |
| H2 | 100 | 2.8 | 4 | 125 | 29.8 | 20.9 | 8.9 |
| H2 | 100 | 2.8 | 4 | 125 | 20.5 | 15 | 5.5 |
| SiH4 | 100 | 1.3 | 4 | 125 | 19.5 | 14.9 | 4.6 |

A point to consider with care when comparing the deposition conditions is the real potential difference to which the ions are subject to when entering the sheath. Once an external bias is applied to the substrate holder, the ion acceleration potential will be the sum of the plasma potential plus the external bias voltage. The plasma potential is determined from the floating potential to which 5V is added as defined above. Given the values found for the different deposition conditions, a DC bias of −30V will not necessarily give an accelerating voltage of 30V, because the plasma potential has to be taken into account to determine the sheath potential (see Table 1). For example, in the case of the d070705 sample (line 2 of Table 2), the accelerating voltage will be 30+29+5=64V. Hence ion acceleration may be much larger than would have been anticipated based on the value of the bias voltage. This is a major effect that has to be taken into account when controlling the deposition on thin films.

Effect of Ion Energy

The influence of the ion energy on the quality of amorphous silicon layers deposited by DECR PECVD has been studied for several process conditions and in particular looking at the silane precursor gas (silane or disilane) and the way of feeding the MW into the reactor (in a CW mode or in a high or low frequency modes).

Each dataset will now be specifically described.

Silane—CW (Continuous Wave) DECR Mode

To determine the effect of the ion energy on the quality of the deposited amorphous silicon layers, the results of depositing ten series of films were correlated with the sheath potential, calculated taking the plasma potential into account as defined previously. The ten series differed from one another as regards various of the factors listed in Table 1 above, but within each series these factors were held constant and the bias potential was varied.

$$E_{ion}=e(V_p-V_{dc})=eV_{sheath}$$

Figure 6A:
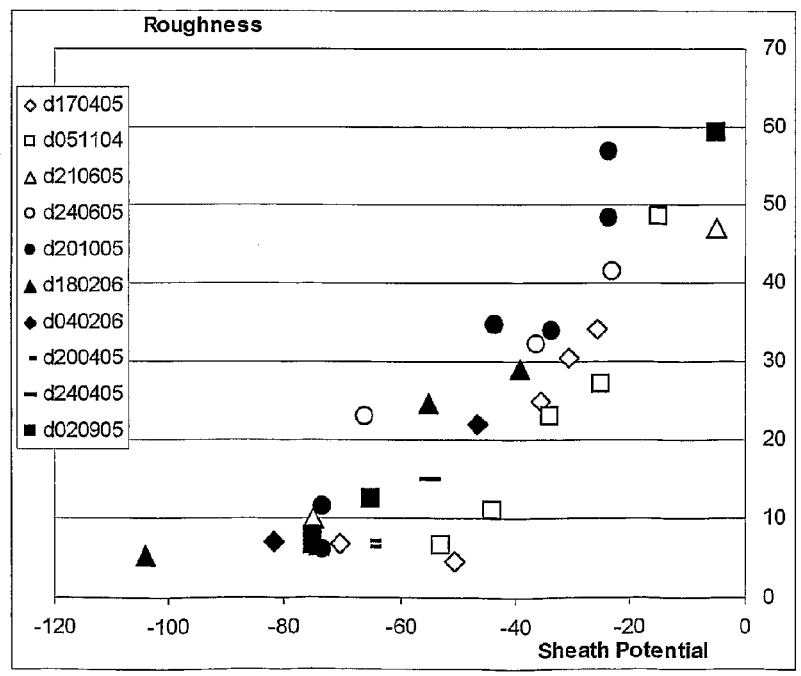
FIGS. 6a to 6d are graphs showing the relationship between roughness, disorder parameter, $\epsilon_i$(max) and Ld on the one hand, and sheath potential on the other, when silane is used for the film precursor gas.
Figure 6B:
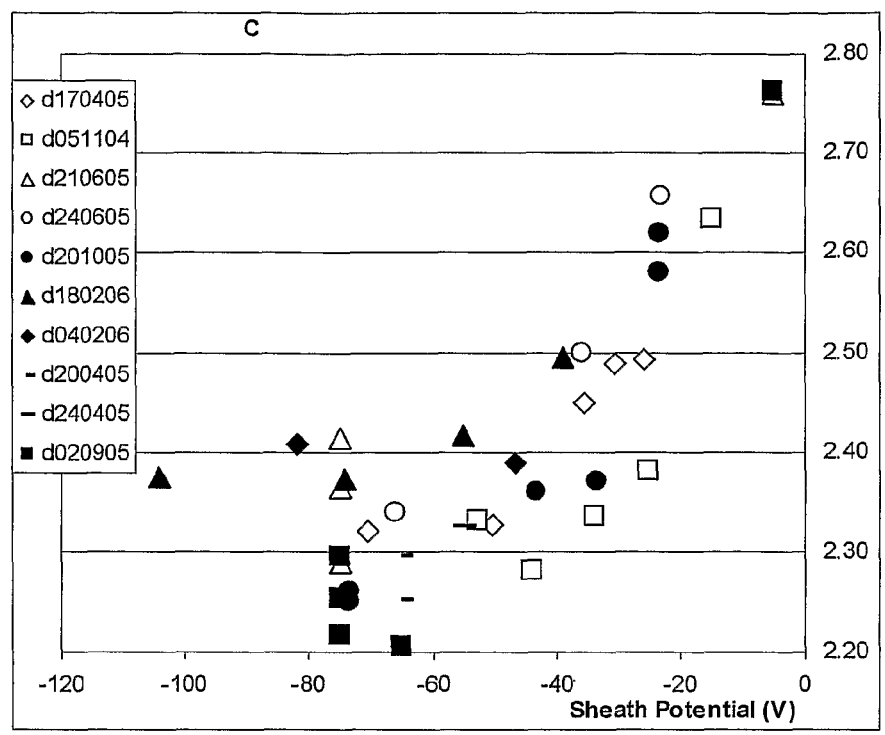
Figure 6C:
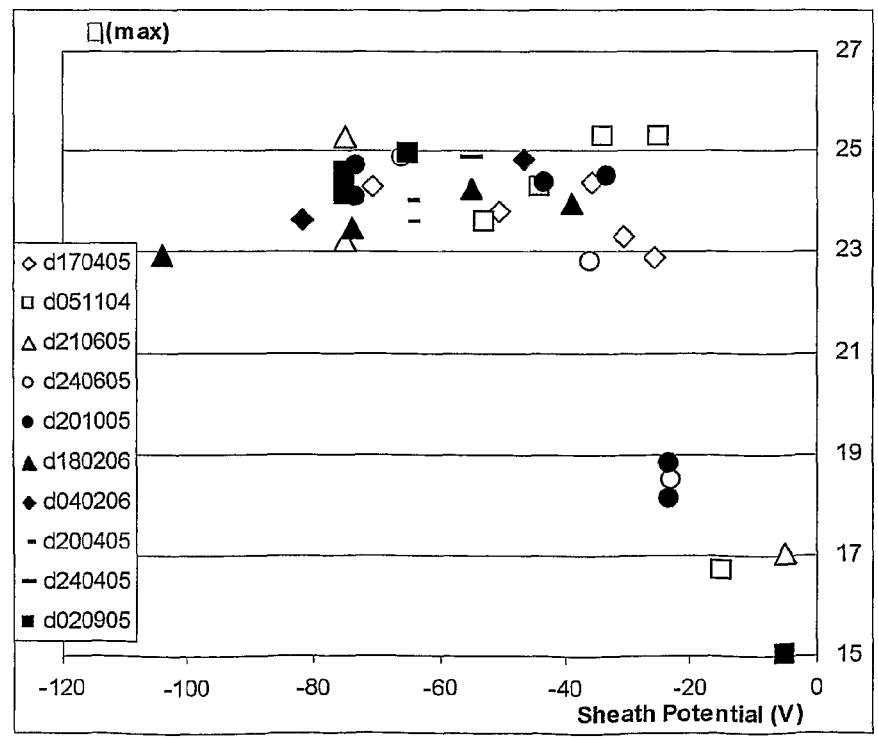

The optical properties of the films were determined by spectroscopic ellipsometry using the Tauc-Lorentz model, while the charge transport properties were measured by SSPG (Steady State Photocarrier Grating), and the results plotted in FIGS. 6a, 6b and 6c for surface roughness, disorder parameter (C) and $\epsilon_i$(max) respectively. Methods for determining these are described, for example, in A. Fontcuberta i Morral, P. Roca i Cabarrocas, C. Clerc, "Structure and hydrogen content of polymorphous silicon thin films studied by spectroscopic ellipsometry and nuclear measurements", PHYSICAL REVIEW B 69, 125307/1-10, 2004.

As can be seen from the graphs, both the surface roughness and the disorder parameter improve as the sheath potential gets more negative and reach an asymptotic value for an acceleration voltage larger than 50/60V. The fact that the sheath potential has to be negative to see property improvement shows that the species involved in this densification process are positive ions.

The material density, represented by the maximum value of the imaginary part of the refractive index $\epsilon_i$(max), reaches its maximum around −35V and then decreases slowly as ion bombardment becomes more energetic. This shows that damage may occur if the ion energy becomes too large and that an operating range for the substrate polarization needs to be defined.

Figure 6D:
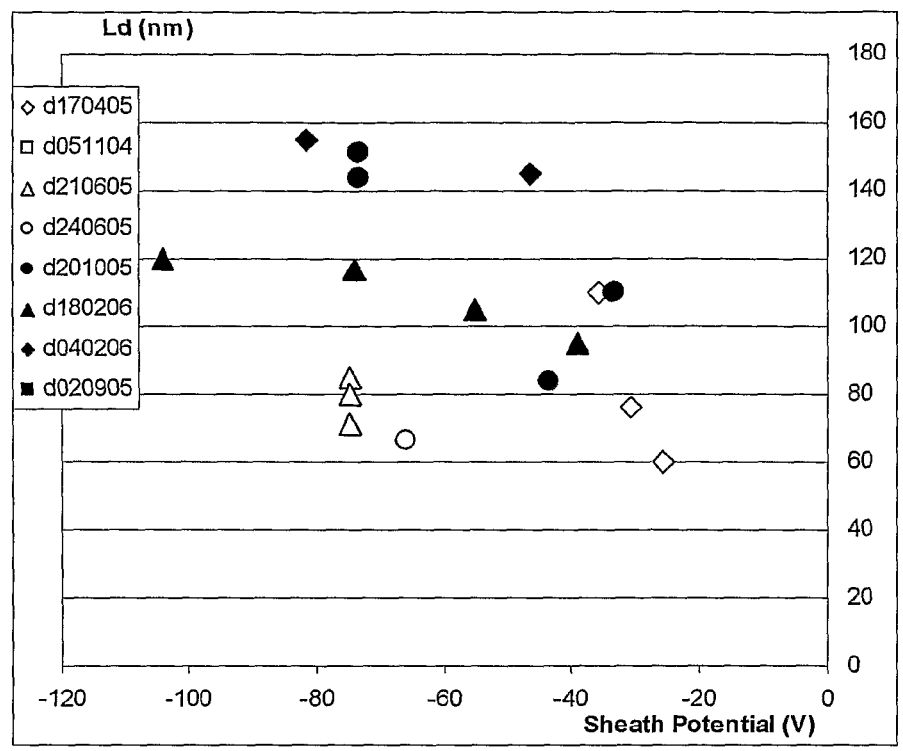

As demonstrated by FIG. 6d, the charge transport properties are also improved as the impinging ion energy increases and a sheath potential of at least −40V is required to obtain a hole diffusion length Ld in excess of 100 nm.

The above correlation of data with the sheath potential is quite remarkable and indicates that the ion acceleration voltage plays a key role in the DECR deposition process.

Based on the data for the roughness, the disorder parameter and the $\epsilon_i$(max) a useful "full" bias (sheath potential) range is −30 to −105V. Based on the Ld data for the 16 antennas mode, such "full" bias range generates material with Ld in excess of 100 nm. The Ld for the 4 central antenna mode was found to be lower, at least under the particular conditions used. However, even for that mode a sheath potential in the same range is believed to be desirable overall.

The correlations presented above for the optical and charge transport properties of the amorphous silicon layers deposited by DECR with the sheath potential are also obtained with the RF power. This is to be expected based on the discussion presented above, which shows that the RF power applied to induce a DC polarization of the substrate surface takes also into account the auto-polarization of the surface in unbiased conditions. The RF power is proportional to the potential drop between the plasma and the substrate and not only the bias voltage which is measured with respect to ground.

A useful sheath potential range of −30 to −105V corresponds to a RF-power range of 25-120 W. As is explained below, this relationship only holds good for a given area of substrate holder. In the present case that was 484 cm². In the "conclusions" section an explanation is given as to how to normalise the RF-power requirement so that it applies to any substrate holder area. Also, this correspondence of sheath potential and RF power was obtained using 2 kW microwave power, 100 sccm silane flow rate and 10 cm spacing between the bottom of the magnets and the substrate. The RF power used will need to be correspondingly adjusted for other process conditions.

Disilane—CW DECR Mode

The effect of the sheath potential on the optical and electrical properties of amorphous silicon layers has also been determined when using disilane as gas precursor. The use of such gas allows deposition of the aSi:H layer at about twice the rate which is possible with silane, and rates larger than 50 Å/s have been measured.

Figure 7A:
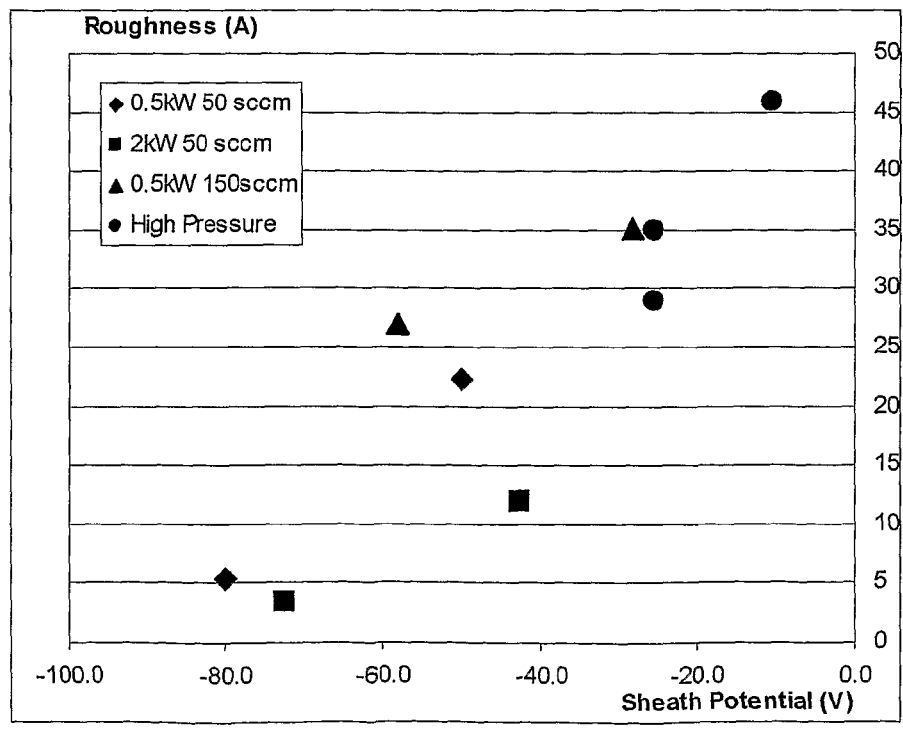
FIGS. 7a to 7c are graphs corresponding to FIGS. 6a to 6c, but where disilane is used as the precursor gas.
Figure 7B:
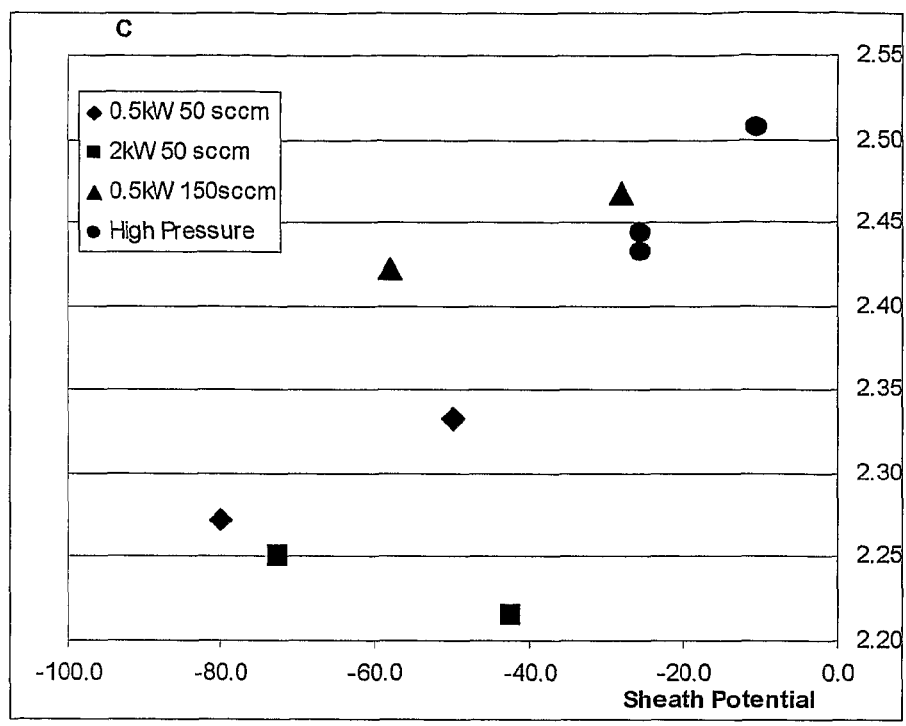
Figure 7C:
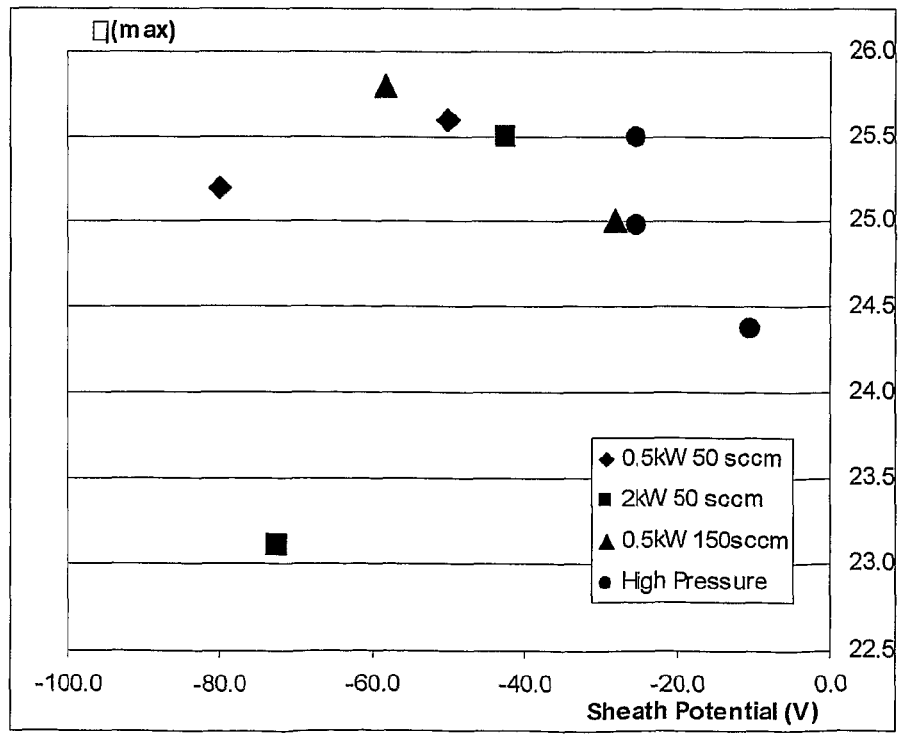

The trends observed with disilane for surface roughness, disorder parameter and $\epsilon_i$(max) are shown in FIGS. 7a to 7c, and are the same as those seen when using silane as the film precursor gas.

The best sheath potential range (−30 to −105V) defined previously for silane seems adequate also for disilane. There thus appears to be no essential difference when using silane or disilane, with the exception that the deposition rate is twice as fast with the latter.

Silane—High Frequency Pulsed DECR Mode

The effect of the sheath potential on the optical and electrical properties of amorphous silicon layers has also been determined when using silane as gas precursor in combination with pulsed MW conditions. A reason why one might wish to pulse the MW energy is explained in our copending application filed on the same date as the present application and entitled "Method for forming a film with a graded bandgap by deposition of an amorphous material from a plasma using distributed electron cyclotron resonance" (our reference G28555EP), where it is discussed in the context of producing a structure with a graded bandgap.

Such MW feeding mode was evaluated at high and low frequencies. Besides the evaluation of the frequency range, this also allowed the assessment of the impact of synchronizing the RF-bias with the MW pulse.

Pulsing the MW at a high frequency (10 kHz in these experiments) does not allow the effect of RF-bias synchronization, because the response time of the substrate holder setup is too slow and the polarization does not relax fully between two MW pulses. This is not the case at low frequency as will be described in the next section.

Figure 8A:
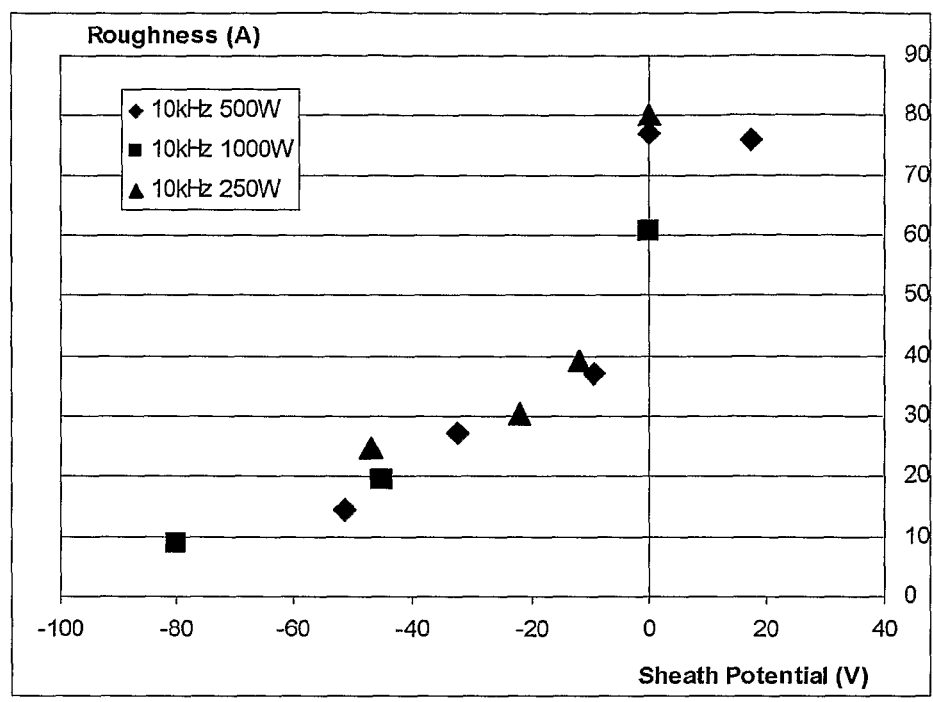
FIGS. 8a to 8c are graphs corresponding to FIGS. 6a to 6c, but where the microwave energy is pulsed at a high frequency (10 kHz), and is at three different energy levels (500 W, 1000 W and 250 W)
Figure 8B:
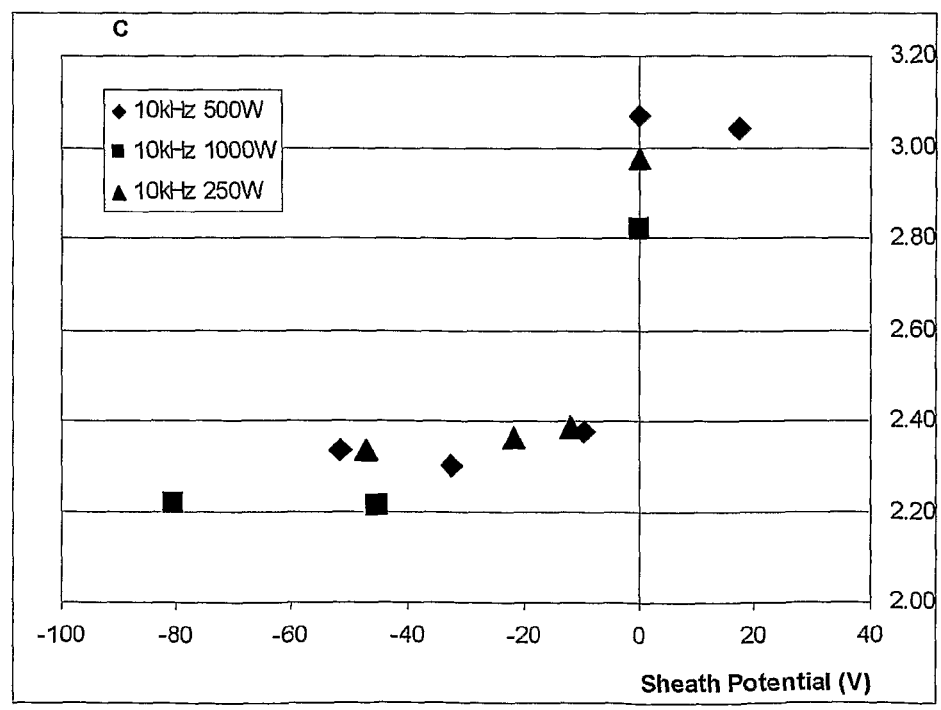
Figure 8C:
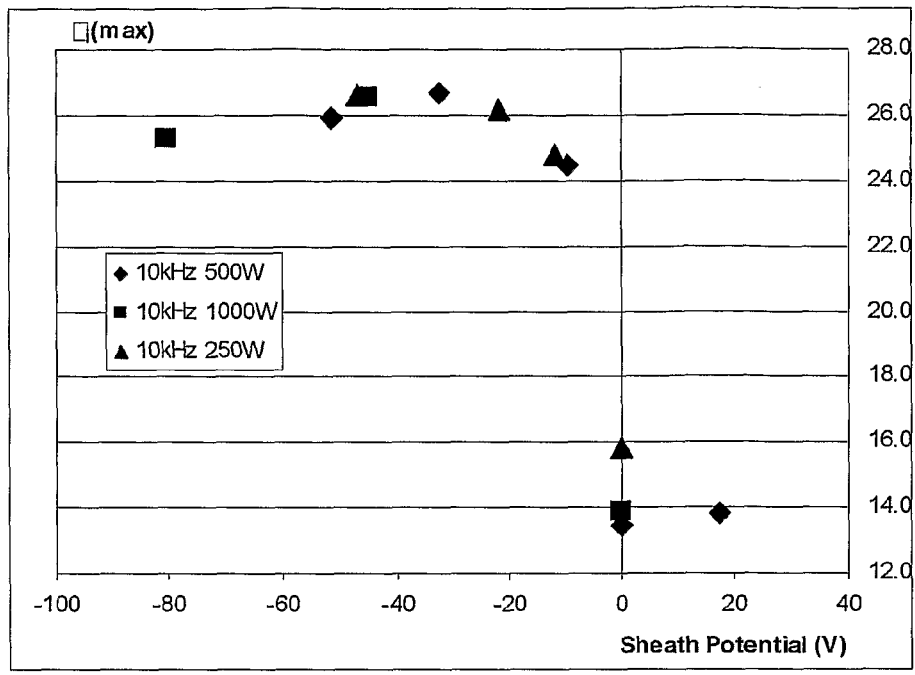

The results for the high frequency pulsed mode are shown in FIGS. 8a, 8b and 8c. From these it can be seen that the trends seen for the CW mode are still observed when pulsing the MW at high frequency, despite the fact that the plasma composition is somewhat different. This again highlights the importance of ion bombardment for deposition high quality layers.

The sheath potential range (−30 to −105V) determined to be optimal for silane in CW mode for achieving low surface roughness, low disorder parameter and high density seems also adequate for the pulsed mode. Interestingly, for silane in the pulsed MW mode, some indications have been found that the bandgap may also be improved, i.e. reduced, an effect not observed in the CW mode.

Silane—Low Frequency Pulsed DECR Mode

The effect of the sheath potential on the optical and electrical properties of amorphous silicon layers has also been determined with silane in combination with low frequency pulsed MW conditions.

Contrary to the high frequency case, synchronization of the pulsed MW signal and the RF-bias signal is possible such that conditions can be achieved for which there is no bias applied when the MW pulsed signal is in the OFF mode. The data obtained is shown in FIGS. 9a to 9d.

From this data, a correlation was established with the RF-power, and experiments to determine the sheath potential were not conducted. However, due to the relationship between the RE-power and the sheath potential, a correlation with RF-power is equivalent to a correlation with sheath potential. For the low frequency pulsed mode, the optimal RE-power range may be shifted lower than the RF-power range (35-120 W) determined to be optimal for the CW and the high frequency modes.

Figure 9A:
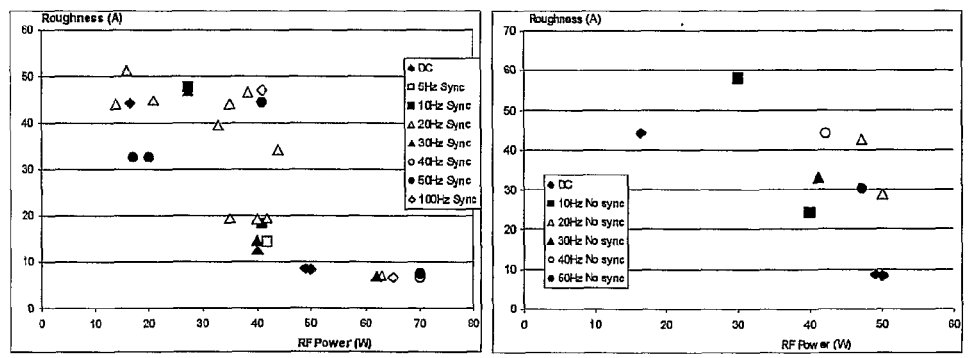
FIGS. 9a to 9d are graphs corresponding to FIGS. 6a to 6d, but where the microwave energy is pulsed at lower frequencies.
Figure 9B:
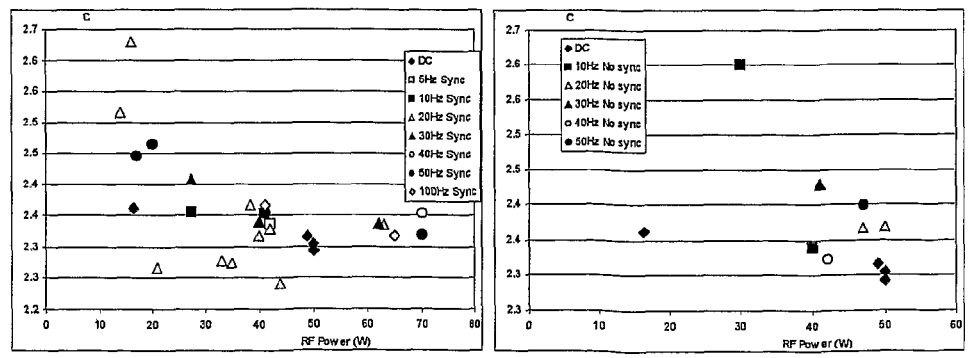
Figure 9C:
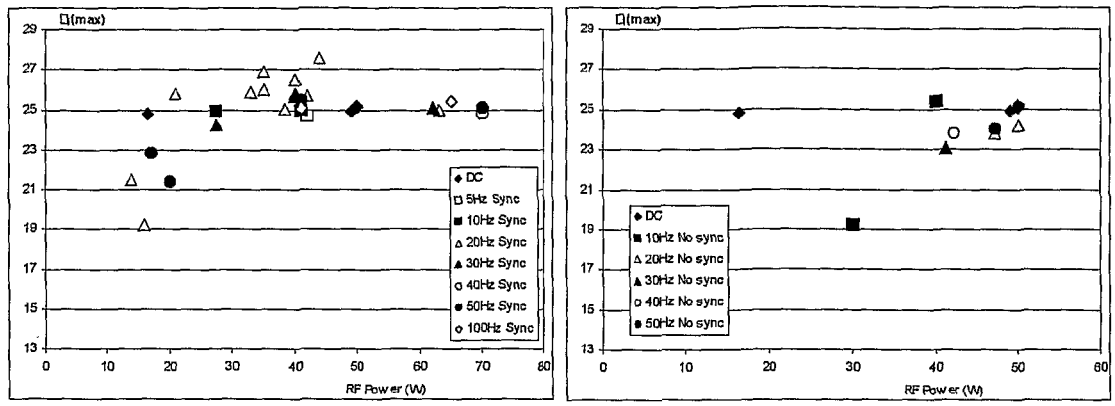
Figure 9D:
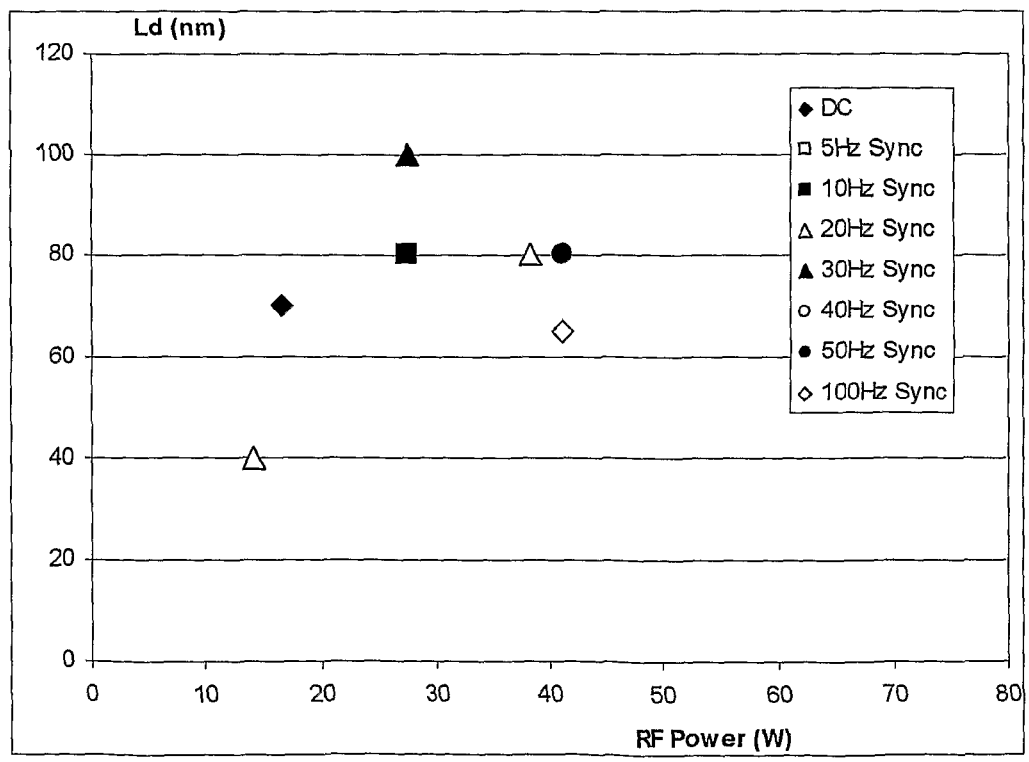
Figure 10A:
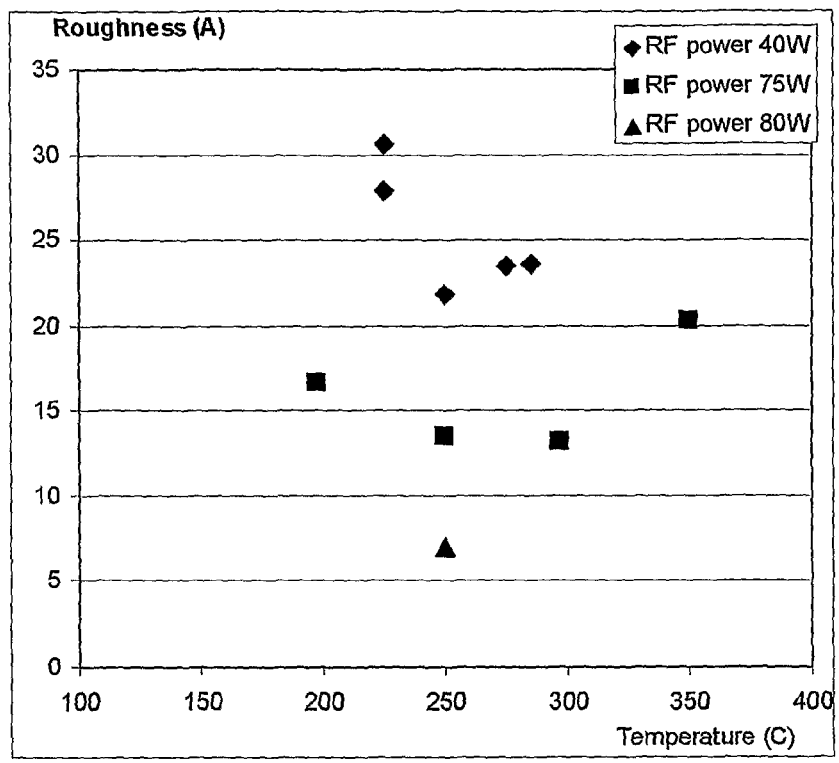
FIGS. 10a to 10e are graphs showing the effect of substrate temperature on roughness, disorder parameter, $\epsilon_i$(max), bandgap, and diffusion length (Ld), respectively.
Figure 10B:
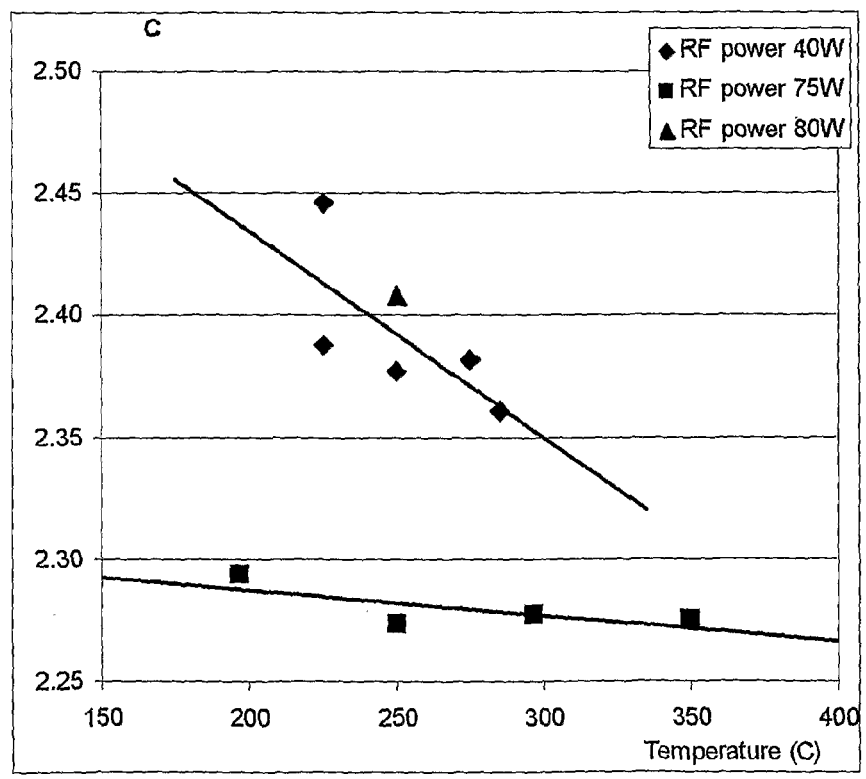
Figure 10C:
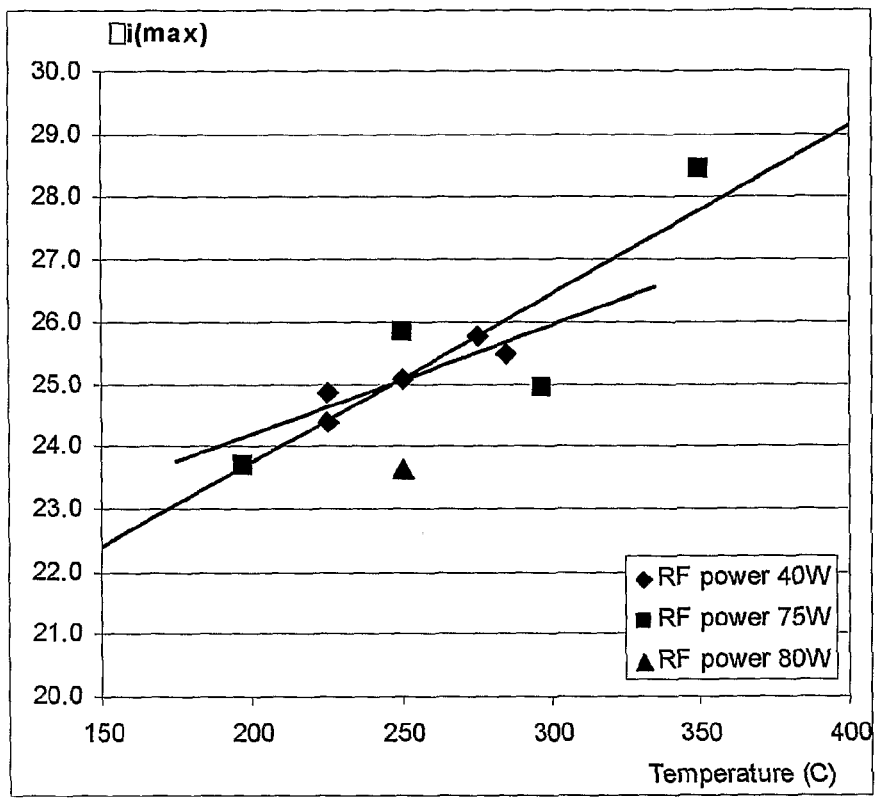
Figure 10D:
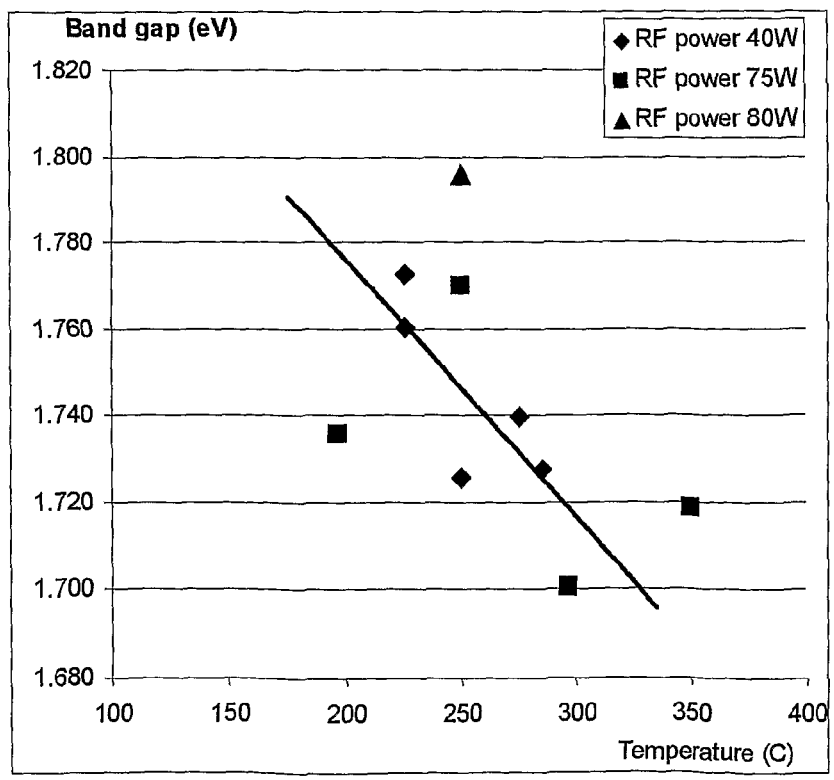
Figure 10E:
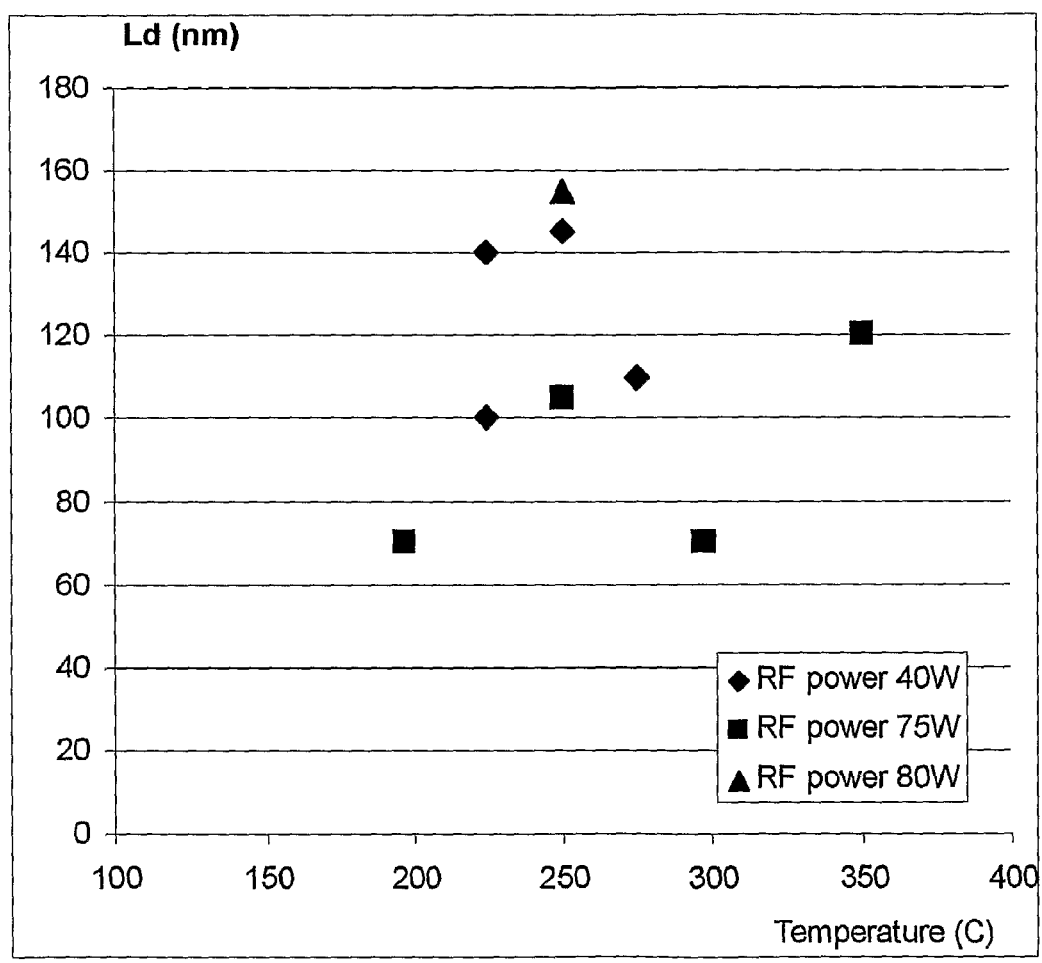

Another important point should be emphasized. As seen in FIGS. 9a, 9b and 9c, for the surface roughness, the disorder parameter and the maximum value of the imaginary part of the refractive index, $\epsilon_i(max)$, (i.e. the material density), synchronizing the RE-bias to the low frequency MW pulse is quite beneficial. As we have demonstrated the importance of the ion bombardment on the growing film to improve its quality, synchronizing the RF-bias and the MW pulse will optimize the use of the ions. It is indeed unnecessary to polarize the substrate when no ions are being produced. On the other hand the generation of ions is likely to be larger at the beginning of the MW pulse and synchronization will ensure optimal use of the ions.

Conclusions in Relation to Ion Energy

Based on the data presented above, it appears that quite good correlations exist between most of the optical properties of the material (determined by ellipsometry) as well as the charge transport property, and the sheath potential at (or the RF power applied to) the substrate. This is an indication of the importance of the ion bombardment for the deposition of high quality layers.

From all the sets of data (silane, disilane, CW-MW mode and pulsed-MW modes), taken together, the optimal ranges are as follows:

RF-power: 25-120 W

Sheath potential: −30 to −105V

This should be corrected for the size of the substrate holder on which the ions are collected and which in the above experiments had an area of 484 $cm^2$. This correction assumes that the substrate holder is larger than the substrate or the same size of the substrate. This will normally be the case, but if the substrate holder were smaller than the substrate, the relevant area for correction would be that of the substrate. In either event, what is being done is to normalise with respect to the whole ion collecting surface. The power density for the optimal deposition conditions is thus:

RF-power: 50-250 $mW/cm^2$

Sheath potential: −30 to −105V

Effect of Temperature

Although it was known in the prior art that the substrate on which an amorphous film was to be deposited by plasma deposition should be heated, the present inventors have found that substrate temperature is critical to a greater extent than previously appreciated and that methods used hitherto to heat the substrate did not in fact heat the substrate reliably to a given temperature.

There are set out below the results of a study in which the substrate was glued directly on the substrate holder with thermally conductive glue (Ag-filled glue), without using an intermediate carrier plate. The glue may comprise a silicone resin (some other resin, e.g. an epoxy, could be used instead), a solvent, and flakes of silver. A high enough concentration of flakes is used to ensure that when the solvent evaporates the flakes touch each other, so that the resulting layer of glue is thermally and electrically conductive. Other glues which might be used include a resin filled with carbon black, and an aluminium oxide paste. The latter is thermally conductive, though not electrically conductive, and is already employed in electronics applications. The use of an Ag-filled glue was demonstrated to allow a good control of the temperature of the substrate surface, and good resulting substrate properties, as set out in the table below. An alternative possibility, though one which is believed to be inferior, is to retain the carrier plate, glue the substrate to the carrier plate using a glue as described above, and/or place between the substrate holder and the carrier plate a layer, for example a carbon foil, which is thermally (and electrically) conductive. Yet another possibility is to use so-called "backside gas heating". This consists in injecting a gas, typically helium, between the substrate holder and the carrier plate so as to have a high enough pressure in this spacing to ensure good thermal transport.

| | T C. | Bias V | RF power W | Rate A/s | Roughness A | Eg eV | C | $\epsilon_i$ (max) | Ld nm |
|---|---|---|---|---|---|---|---|---|---|
| d030206-2 | 250 | −60 | 81 | 27.0 | 7 | 1.796 | 2.41 | 23.63 | 155 |
| d050206-1-1 | 225 | −25 | 44 | 24.4 | 31 | 1.773 | 2.39 | 24.40 | 100 |
| d090206-3-avg | 225 | −25 | 37 | 25.5 | 28 | 1.760 | 2.45 | 24.85 | 140 |
| d040206-1 avg | 250 | −25 | 44 | 28.7 | 22 | 1.726 | 2.38 | 25.07 | 145 |
| d080206-1 avg | 275 | −25 | 44 | 24.4 | 23 | 1.740 | 2.38 | 25.78 | 110 |
| d0502062 | 285 | −25 | 44 | 23.1 | 24 | 1.727 | 2.36 | 25.48 | |
| d200106-2 avg | 197 | −60 | 75 | 37.4 | 17 | 1.736 | 2.29 | 23.68 | 70 |
| d190196-2 avg | 250 | −60 | 75 | 36.6 | 13 | 1.770 | 2.27 | 25.85 | 105 |
| d200106-1 avg | 297 | −60 | 75 | 36.8 | 13 | 1.701 | 2.28 | 24.96 | 70 |
| d190106-1 avg | 350 | −60 | 75 | 34.5 | 20 | 1.719 | 2.27 | 28.45 | 120 |

As indicated in the table, most of the data points were the average of two measurements.

The impact of the temperature can be seen more clearly from the graphs which appear as FIGS. 10a to 10e.

Thus, the effect of the temperature on the maximum value of the imaginary part of the constant, (FIG. 10c) and the material bandgap (FIG. 10d) is quite clear and essentially the same whatever the RF-power applied. In both cases, increasing the temperature significantly improves the material optical property.

The disorder parameter is also affected by the temperature (FIG. 10b) but the very large effect of the bias is also seen clearly in the graph, indicating that such property, related to the medium range order of the atoms in the film matrix, is mostly affected by the energy of the ions impinging on the film surface rather than by the temperature. This may be due to the fact that the majority of ions in the $SiH_4$/DECR plasma are $H_x^+$ and do not bring much kinetic energy to the growing film for its rearrangement. The ion contribution may be more linked to hydrogen recombination, diffusion or implantation into the film. The behaviour of the disorder parameter with temperature and bias is quite interesting because it shows that the bias is the most important factor and that the temperature tends to lose its impact when the bias increases.

The surface roughness (FIG. 10a) is also much more influenced by the ion energy than by the temperature.

For the diffusion length (FIG. 10e) the contribution of temperature is quite clear, though the ion bombardment energy will also have a major impact. Looking at FIG. 10e, it can be seen that the diffusion length improves with increased temperature but the effect of the substrate bias should not be overlooked.

Conclusions in Relation to Temperature

Based on the data shown above, and considering the bias range in which these materials have been grown, it is clear that the deposition of amorphous silicon should be carried out at a temperature of at least 200° C. It is, however, known that amorphous silicon can be thermally crystallized at temperature in excess of 600° C. Such value should thus be considered as an absolute upper limit. However, where the amorphous silicon is to be used as the intrinsic layer in the fabrication of devices such as thin-film solar cells, a lower upper limit has to be set. This is because such devices also possess a p-doped layer and n-doped layer, and p-doped layers in particular are quite temperature sensitive, and cannot normally withstand temperatures of more than 350° C., though the n-doped layer is normally more resistant. If a higher temperature than 350° C. is to be used in making such devices a modification of the process will be required, such as post-diffusing boron into the bottom layer, i.e. causing boron to diffuse from the substrate into the bottom part of the intrinsic layer to convert that part into a p-type layer, after, or during, the high temperature deposition of the intrinsic layer. (A similar process could be used to create an n-type layer after high temperature deposition of the intrinsic layer, this time using a material such as phosphorus instead of boron).

Overall Conclusions

From the above discussion it can be seen that ion bombardment energy and substrate temperature have a major impact on the properties of aSi:H film, and correct selection of both is essential to grow high quality material.

For surface roughness and the disorder parameter, the ion energy contribution is absolutely essential for the growth of a high quality film. For other properties, notably the material bandgap, it is the temperature which is the most important, and good quality material can be grown without large bias. However, there are yet other properties, such as the maximum value of the imaginary part of the constant and the charge diffusion length, which require both the temperature and the ion impact to lie within particular ranges if the material is to qualify as good. This means that these two deposition parameters cannot be dissociated from one another, and both are essential for the growth of a high quality material.

Based on the data generated, a DECR plasma deposition should operate in the following range:
  RF-power: 50-250 mW/cm$^2$
  Sheath potential: −30 to −105V
  Temperature: 200-600° C.

Under these conditions, high quality aSi:H can be grown at very high rate (>20 Å/s) from Si-based film precursor gases. This applies for any mode of feeding the MW into the reactor. It was also found that in the low frequency pulse mode, synchronizing the MW pulse and the RF-bias is beneficial for the material quality.

The invention claimed is:
1. A method of forming a film of an amorphous silicon (a-Si:H) on a substrate by deposition from a plasma, the method comprising:
  placing the substrate in an enclosure,
  introducing into the enclosure a film precursor gas at a flow rate,
  extracting unreacted and dissociated gas from the enclosure so as to provide a low pressure in the enclosure, and
  introducing microwave energy into gas within the enclosure to produce a plasma therein by distributed electron cyclotron resonance (DECR) and cause the material to be deposited from the plasma on the substrate, wherein the substrate is held during deposition at a temperature in the range of 225-600° C., and wherein an RF bias voltage is applied to the substrate at a level to give rise to a sheath potential in the range of −30 to −105V.

2. The method of claim 1, wherein the sheath potential is in the range of −35 to −85V.

3. The method according to claim 1, wherein the substrate is attached to a substrate holder by a conductive adhesive, and heat is supplied to the substrate holder.

4. The method according to claim 3, wherein the substrate is non-conductive, and wherein the bias voltage is applied thereto by a source of RF power.

5. The method according to claim 4, wherein the RF power is in the range of 50-250 mW/cm$^2$ of the area of the ion collecting surface.

6. The method according to claim 1, wherein the temperature is not more than 350° C.

7. The method according to claim 1, wherein the film precursor gas is introduced into the enclosure in a direction towards the substrate.

8. The method according to claim 2, further comprising the steps of:

attaching the substrate to a substrate holder using a conductive adhesive, and applying heat to the substrate holder.

* * * * *